United States Patent
Tozawa

(10) Patent No.: US 8,991,333 B2
(45) Date of Patent: Mar. 31, 2015

(54) SUBSTRATE PROCESSING METHOD AND SYSTEM

(75) Inventor: Shigeki Tozawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 812 days.

(21) Appl. No.: 13/292,518

(22) Filed: Nov. 9, 2011

(65) Prior Publication Data

US 2012/0055401 A1   Mar. 8, 2012

Related U.S. Application Data

(63) Continuation of application No. 12/314,933, filed on Dec. 18, 2008, now abandoned.

(30) Foreign Application Priority Data

Dec. 27, 2007 (JP) ................. 2007-336521

(51) Int. Cl.
| | | |
|---|---|---|
| C23C 16/30 | (2006.01) | |
| C23C 16/56 | (2006.01) | |
| C23C 16/44 | (2006.01) | |
| C23C 16/52 | (2006.01) | |
| H01L 21/02 | (2006.01) | |
| H01L 21/67 | (2006.01) | |
| H01L 21/768 | (2006.01) | |

(52) U.S. Cl.
CPC .... *H01L 21/02063* (2013.01); *H01L 21/67173* (2013.01); *H01L 21/6719* (2013.01); *H01L 21/67201* (2013.01); H01L 21/76897 (2013.01)
USPC ........... 118/697; 118/715; 118/719; 118/696; 156/345.31; 156/345.33; 156/345.34

(58) Field of Classification Search
USPC ............ 118/715, 719, 696, 697; 156/345.31, 156/345.33, 345.34
See application file for complete search history.

(56) References Cited

U.S. PATENT DOCUMENTS

| | | | |
|---|---|---|---|
| 6,264,852 B1 | 7/2001 | Herchen et al. | |
| 6,541,351 B1* | 4/2003 | Bartlau et al. | 438/426 |
| 6,852,584 B1* | 2/2005 | Chen et al. | 438/197 |
| 6,951,821 B2* | 10/2005 | Hamelin et al. | 438/706 |
| 7,079,760 B2* | 7/2006 | Hamelin et al. | 392/416 |
| 2003/0022436 A1* | 1/2003 | Zheng | 438/244 |
| 2003/0235999 A1* | 12/2003 | Kim et al. | 438/763 |
| 2004/0182417 A1 | 9/2004 | Hamelin et al. | |
| 2004/0184792 A1 | 9/2004 | Hamelin et al. | |
| 2005/0221513 A1* | 10/2005 | Yue et al. | 438/14 |
| 2005/0233093 A1* | 10/2005 | Tada et al. | 427/569 |
| 2006/0189138 A1* | 8/2006 | Nishimura et al. | 438/692 |
| 2006/0194435 A1* | 8/2006 | Nishimura et al. | 438/689 |
| 2006/0224265 A1* | 10/2006 | Nakayama et al. | 700/108 |

(Continued)

FOREIGN PATENT DOCUMENTS

| | | |
|---|---|---|
| JP | 05-006880 | 1/1993 |
| JP | 2005-039185 | 2/2005 |

*Primary Examiner* — Jeffrie R Lund
(74) *Attorney, Agent, or Firm* — Smith, Gambrell & Russell LLP.

(57) ABSTRACT

A substrate processing method includes a first step of subjecting a target substrate to a gas process within an atmosphere containing a fluorine-containing process gas, thereby forming a fluorine-containing reaction product on a surface of the target substrate. The method further includes a second step of subjecting the target substrate treated by the gas process to a heating process and a gas process within an atmosphere containing a reactive gas that reacts with fluorine.

19 Claims, 12 Drawing Sheets

(56) References Cited

U.S. PATENT DOCUMENTS

| | | |
|---|---|---|
| 2007/0111338 A1* | 5/2007 | Yue et al. .......................... 438/5 |
| 2007/0170552 A1* | 7/2007 | Zheng et al. ................... 257/649 |
| 2007/0212846 A1* | 9/2007 | Yokouchi et al. ............. 438/402 |
| 2007/0213864 A1* | 9/2007 | Iijima .......................... 700/121 |
| 2008/0124936 A1* | 5/2008 | Nishimura ................... 438/706 |
| 2008/0281625 A1* | 11/2008 | Shiki ................................. 705/1 |
| 2009/0081815 A1* | 3/2009 | Yamashita et al. ................ 438/9 |
| 2009/0191340 A1* | 7/2009 | Tozawa .................... 427/255.39 |
| 2009/0275205 A1* | 11/2009 | Kiehlbauch et al. .......... 438/712 |
| 2010/0163179 A1* | 7/2010 | Tozawa et al. ............. 156/345.1 |
| 2010/0304561 A1* | 12/2010 | Narushima et al. .......... 438/653 |
| 2011/0035957 A1* | 2/2011 | Muraki et al. ................... 34/427 |
| 2012/0055401 A1* | 3/2012 | Tozawa ......................... 118/697 |

\* cited by examiner

SUBSTRATE PROCESSING METHOD AND SYSTEM

CROSS REFERENCE TO RELATED APPLICATION

This application is a continuation of Ser. No. 12/314,933 filed Dec. 18, 2008 and which is being incorporated in its entirety herein by reference.

BACKGROUND OF THE INVENTION

1. Field of the Invention

The present invention relates to a substrate processing method and substrate processing system for performing a gas process on a target substrate, such as a semiconductor wafer, while supplying a process gas onto the target substrate, and also to a computer readable storage medium that stores a program for controlling the substrate processing system.

2. Description of the Related Art

In recent years, in the process of manufacturing semiconductor devices, a method called "chemical oxide removal (COR) process" has attracted attention as a method alternative to dry etching or wet etching for realizing a fine etching process.

As a method of this kind for etching a silicon dioxide ($SiO_2$) film formed on the surface of a target object, such as a semiconductor wafer, the following process is known (for example, see US 2004/0182417 A1, US 2004/0184792 A1, and Jpn. Pat. Appln. KOKAI Publication No. 2005-39185). Specifically, while the temperature of the target object is adjusted under a vacuum state, a mixture gas of hydrogen fluoride (HF) gas and ammonia ($NH_3$) gas is supplied into a chamber. The mixture gas reacts with the silicon dioxide and generates ammonium fluorosilicate (($NH_4$)$_2$$SiF_6$). The ammonium fluorosilicate is heated and thereby sublimed in the subsequent step, so that the silicon dioxide film is consumed and etched from the surface.

In recent years, since semiconductor devices are being miniaturized, the integration level of semiconductor integrated circuit devices is being increased. With an increase in the level of miniaturization and integration, the size of contact holes formed in semiconductor integrated circuit device chips becomes smaller and the number of contact holes formed in each chip becomes larger.

The COR described above is effective for removing a silicon dioxide film formed at the bottom of contact holes, i.e., a so-called natural oxide film, which has been generated in forming the holes.

However, as the size of contact holes is smaller and the number of contact holes is larger, fluorine and/or fluorine compound are more likely to be left as residues in the contact holes. If a reactive halogen and/or halogen compound, particularly fluorine and/or fluorine compound, are left in the contact holes, they may cause abnormal reactions with components of integrated circuits, such as a silicon substrate, gate electrodes, gate electrode sidewall insulating films, interlevel insulating films, and interconnection layers. Such abnormal reactions deteriorate the yield of semiconductor integrated circuit devices.

BRIEF SUMMARY OF THE INVENTION

An object of the present invention is to provide a substrate processing method and substrate processing system that can decrease the probability of abnormal reactions being caused and thereby maintain and improve the characteristic and yield of semiconductor integrated circuit devices, and further to provide a computer readable storage medium that stores a program for controlling the substrate processing system.

According to a first aspect of the present invention, there is provided a substrate processing method comprising: a first step of subjecting a target substrate to a gas process within an atmosphere containing a fluorine-containing process gas, thereby forming a fluorine-containing reaction product on a surface of the target substrate; and a second step of subjecting the target substrate treated by the gas process to a heating process and a gas process within an atmosphere containing a reactive gas that reacts with fluorine.

According to a second aspect of the present invention, there is provided a substrate processing system comprising: a gas process section including a process gas supply section for supplying a fluorine-containing process gas, the gas process section being configured to subject a target substrate to a gas process within an atmosphere containing the fluorine-containing process gas, which is supplied from the process gas supply section, thereby forming a fluorine-containing reaction product on a surface of the target substrate; and a heating and gas process section including a heating mechanism for heating the target substrate and a reactive gas supply section for supplying a reactive gas that reacts with fluorine, the heating and gas process section being configured to subject the target substrate treated by the gas process to a heating process by the heating mechanism and a gas process within an atmosphere containing the reactive gas that reacts with fluorine, which is supplied from the reactive gas supply section.

According to a third aspect of the present invention, there is provided a substrate processing system comprising: a gas process section including a process gas supply section for supplying a fluorine-containing process gas, the gas process section being configured to subject a target substrate to a gas process within an atmosphere containing the fluorine-containing process gas, which is supplied from the process gas supply section, thereby forming a fluorine-containing reaction product on a surface of the target substrate; and a heating process section including a heating mechanism for heating the target substrate, the heating process section being configured to subject the target substrate treated by the gas process to a heating process by the heating mechanism, wherein the gas process section further includes a reactive gas supply section for supplying a reactive gas that reacts with fluorine, and is configured to subject the target substrate treated by the heating process to a gas process within an atmosphere containing the reactive gas that reacts with fluorine, which is supplied from the reactive gas supply section.

According to a fourth aspect of the present invention, there is provided a substrate processing method using the substrate processing system according to the second aspect, the method comprising a first step of transferring the target substrate into the gas process section, supplying the fluorine-containing process gas into the gas process section, subjecting the target substrate to a gas process within an atmosphere containing the fluorine-containing process gas, thereby forming a fluorine-containing reaction product on a surface of the target substrate; and a second step of transferring the target substrate treated by the gas process from the gas process section into the heating and gas process section, subjecting the target substrate treated by the gas process to a heating process in the heating and gas process section, supplying the reactive gas that reacts with fluorine into the heating and gas process section, and subjecting the target substrate to a gas process within an atmosphere containing the reactive gas that reacts with fluorine.

According to a fifth aspect of the present invention, there is provided a substrate processing method using the substrate processing system according to the third aspect, the method comprising a first step of transferring the target substrate into the gas process section, supplying the fluorine-containing process gas into the gas process section, subjecting the target substrate to a gas process within an atmosphere containing the fluorine-containing process gas, thereby forming a fluorine-containing reaction product on a surface of the target substrate; a second step of transferring the target substrate treated by the gas process from the gas process section into the heating process section, and subjecting the target substrate treated by the gas process to a heating process in the heating process section, thereby decomposing the fluorine-containing reaction product; and a third step of transferring the target substrate treated by the heating process from the heating process section into the gas process section, supplying the reactive gas that reacts with fluorine into the gas process section, and subjecting the target substrate to a gas process within an atmosphere containing the reactive gas that reacts with fluorine, thereby removing residues containing fluorine and/or fluorine compound from the surface of the target substrate treated by the heating process.

According to a sixth aspect of the present invention, there is provided a computer readable storage medium that stores a control program for execution on a computer to control the substrate processing system, wherein, when executed, the control program controls the substrate processing system to conduct the substrate processing method according to either one of the forth and fifth aspects.

Additional objects and advantages of the invention will be set forth in the description which follows, and in part will be obvious from the description, or may be learned by practice of the invention. The objects and advantages of the invention may be realized and acquired by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings.

(First Embodiment)

Figure 1:
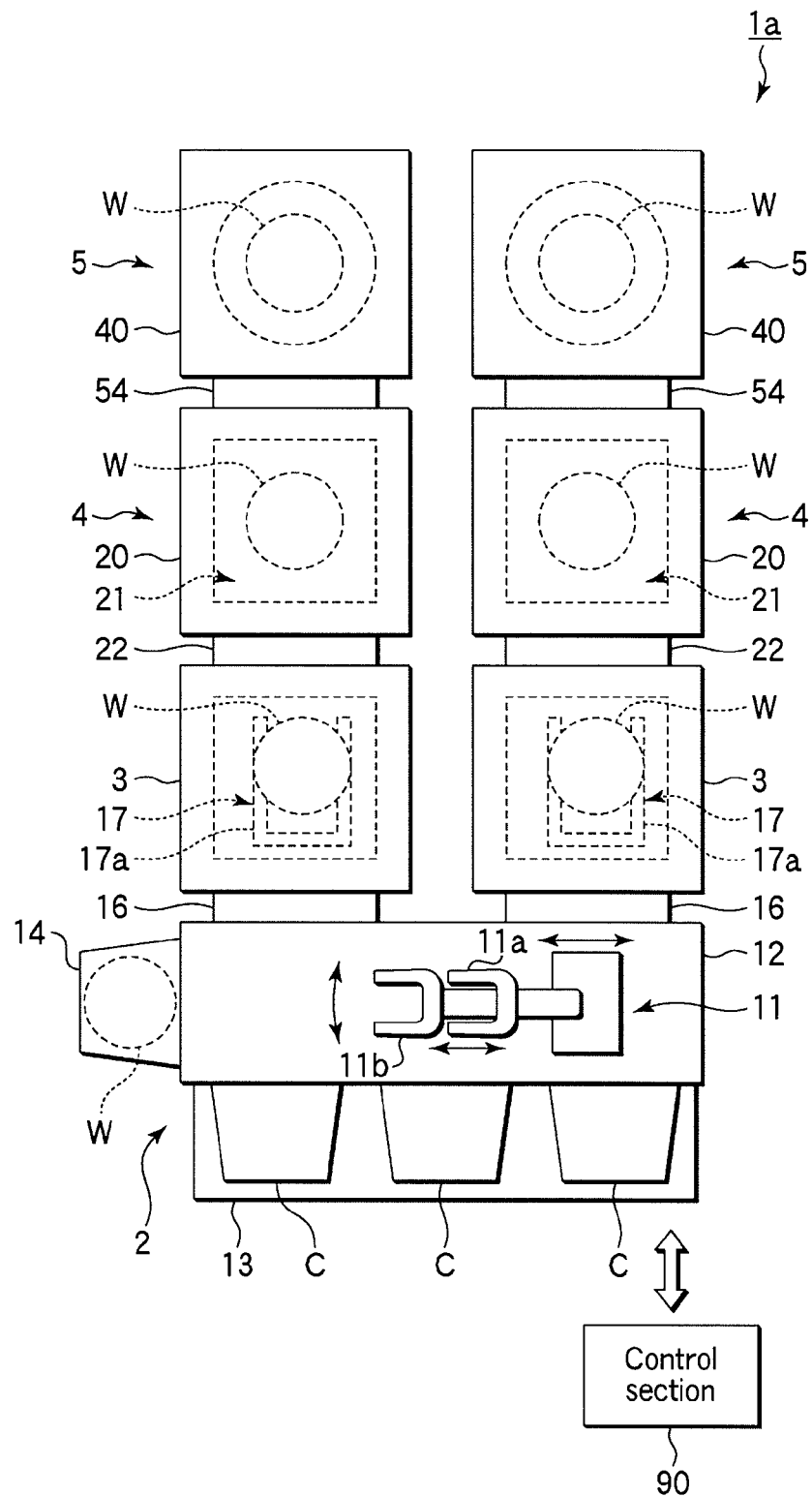
FIG. 1 is a plan view schematically showing the structure of a processing system according to a first embodiment of the present invention.

FIG. 1 is a plan view schematically showing the structure of a processing system according to a first embodiment of the present invention. This processing system 1a includes a load/unload section for loading and unloading semiconductor wafers (which may be simply referred to as "wafer" hereinafter) W to and from the processing system 1a. Two load lock chambers (L/L) 3 are disposed adjacent to the load/unload section 2. PHT processing apparatuses (PHT) 4 are respectively disposed adjacent to the load lock chambers 3 and each configured to perform a PHT (Post Heat Treatment) process on a wafer W. COR processing apparatuses (COR) 5 are respectively disposed adjacent to the PHT processing apparatuses 4 and each configured to perform a COR process on a wafer W. The load lock chambers 3, PHT processing apparatuses 4, and COR processing apparatuses 5 are arrayed in rows in this order.

The load/unload section 2 includes a transfer chamber (L/M) 12 provided with a first wafer transfer mechanism 11 disposed therein to transfer wafers W. The first wafer transfer mechanism 11 includes two transfer arms 11a and 11b each for supporting a wafer W essentially in a horizontal state. A table 13 is disposed along the longitudinal side of the transfer chamber 12 and is provided with, e.g., three carriers C each of which can store a plurality of wafers W in an arrayed state. An orienter 14 is disposed adjacent to the transfer chamber 12 and configured to optically detect misalignment of a wafer W by rotating the wafer W and to perform alignment of the wafer W.

In the load/unload section 2, wafers W are supported by the transfer arms 11a and 11b, and are transferred to predetermined positions by the first wafer transfer mechanism 11 being moved linearly in a horizontal direction and a vertical direction. Further, wafers W are loaded and unloaded to and from the carriers C on the table 13, the orienter 14, and the load lock chambers 3 by the transfer arms 11a and 11b being moved back and forth.

The load lock chambers 3 are connected to the transfer chamber 12 respectively through gate valves 16 interposed therebetween. Each of the load lock chambers 3 is provided with a second wafer transfer mechanism 17 disposed therein to transfer wafers W. Each of the load lock chambers 3 is configured to be vacuum-exhausted to a predetermined vacuum level.

Figure 2:
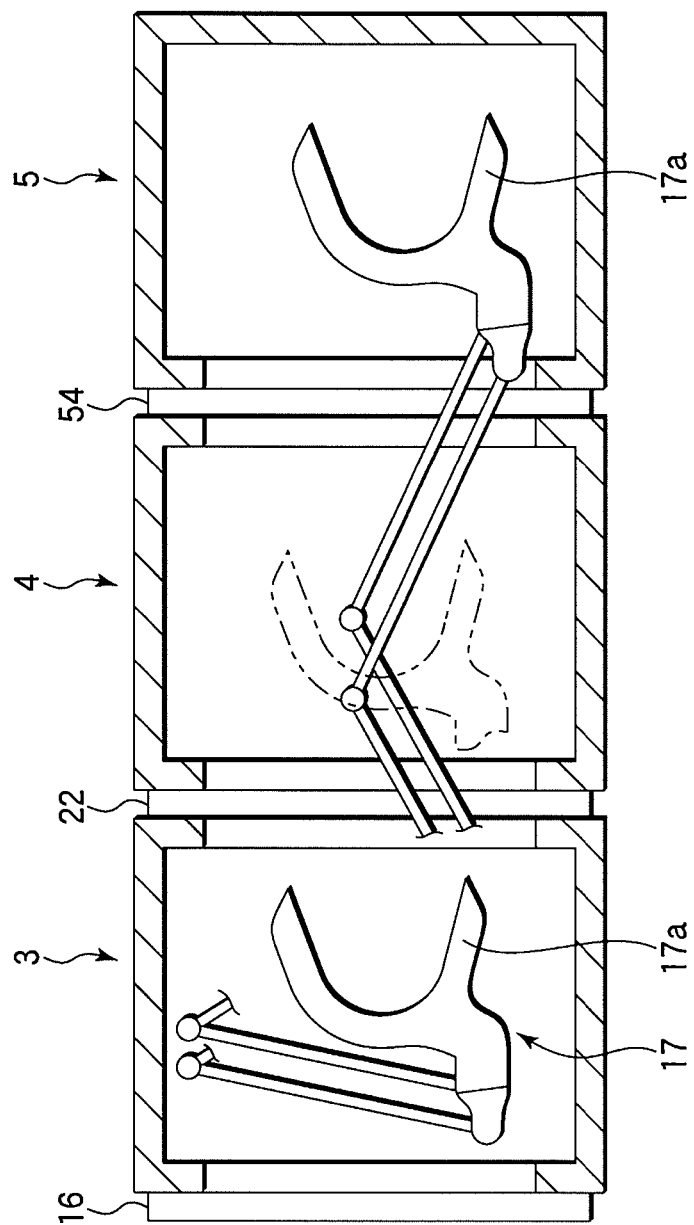
FIG. 2 is a plan view showing the structure of a second wafer transfer mechanism disposed in the processing system shown in FIG. 1.

As shown in FIG. 2, the second wafer transfer mechanism 17 has an articulated structure with a transfer arm 17a configured to support a wafer W essentially in a horizontal state. According to the wafer transfer mechanism 17, when the articulated structure is contracted, the transfer arm 17a is positioned inside the load lock chamber 3. When the articulated structure is extended, the transfer arm 17a is positioned inside the PHT processing apparatus 4. When the articulated structure is further extended, the transfer arm 17a is positioned inside the COR processing apparatus 5. Accordingly, when a wafer W is supported on the transfer arm 17a and the articulated structure of the second wafer transfer mechanism 17 is extended and/or contracted, the wafer W is transferred among the load lock chamber 3, PHT processing apparatus 4, and COR processing apparatus 5.

Figure 3:
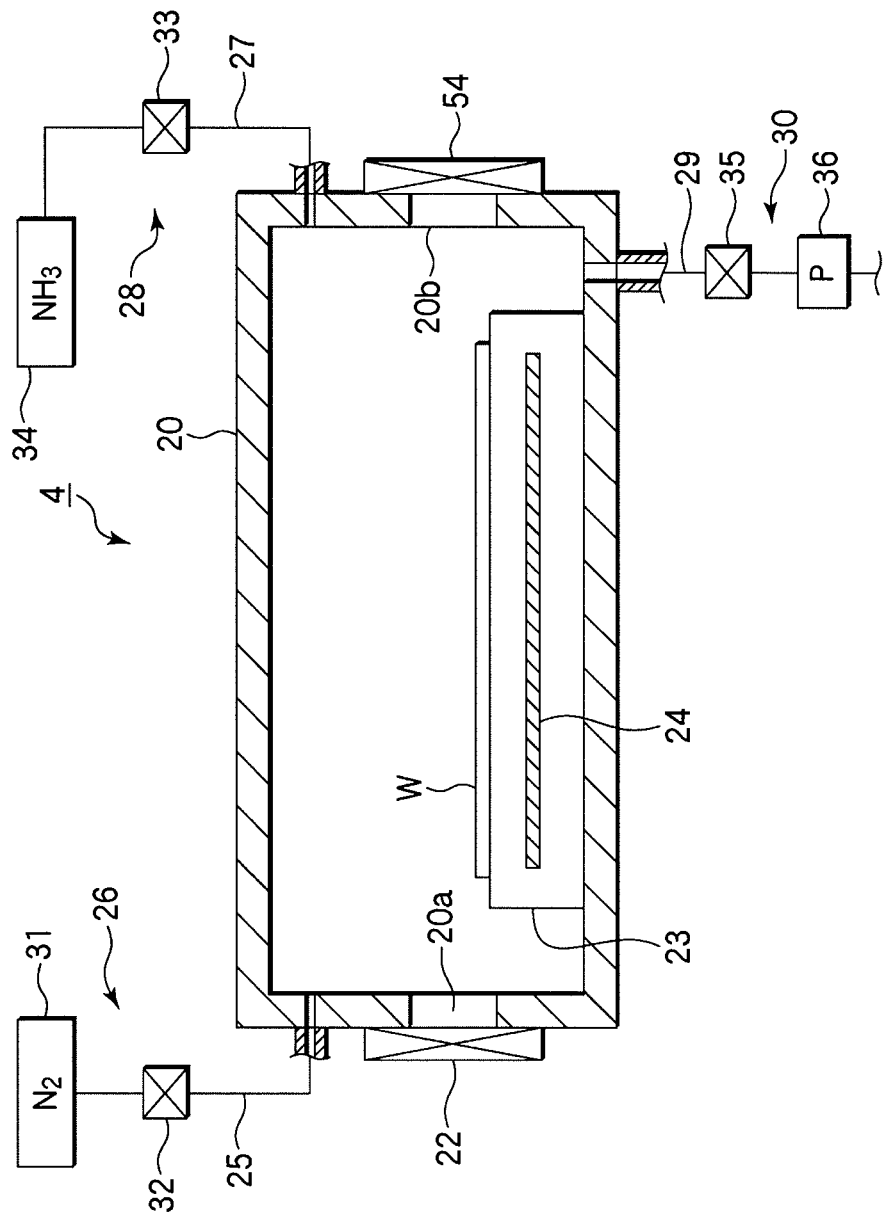
FIG. 3 is a sectional view showing a PHT processing apparatus disposed in the processing system shown in FIG. 1.

As shown in FIG. 3, each of the PHT processing apparatuses 4 includes a chamber 20 that is configured to be vacuum-exhausted and is provided with a table 23 disposed therein to support a wafer W. A heater 24 is embedded in the table 23 to heat a wafer W treated by the COR process, so as to perform a PHT process for evaporating (subliming) a reaction product generated by the COR process. The chamber 20 has a transfer port 20a on the load lock chamber 3 side to transfer a wafer therethrough between the chamber 20 and load lock chamber 3. The transfer port 20a is configured to be opened and closed by a gate valve 22. The chamber 20 further has a transfer port 20b on the COR processing apparatus 5 side to transfer a wafer therethrough between the chamber 20 and COR processing apparatus 5. The transfer port 20b is configured to be opened and closed by a gate valve 54. The chamber 20 is connected to an inactive gas supply mechanism 26 including a gas supply passage 25 for supplying an inactive gas, such as nitrogen gas ($N_2$), and a reactive gas supply mechanism 28 including a gas supply passage 27 for supplying a gas, such as ammonia gas ($NH_3$), which reacts with, e.g., fluorine (F). The chamber 20 is further connected to an exhaust mechanism 30 including an exhaust passage 29 for exhausting gas from inside the chamber 20. The inactive gas supply passage 25 is connected to a nitrogen gas supply source 31. The inactive gas supply passage 25 is provided with a flow rate regulation valve 32 configured to open and close the passage and to adjust the supply flow rate of nitrogen gas. The reactive gas supply passage 27 is connected to an ammonia gas supply source 34. The reactive gas supply passage 27 is provided with a flow rate regulation valve 33 configured to open and close the passage and to adjust the supply flow rate of $NH_3$ gas. The exhaust passage 29 of the exhaust mechanism 30 is provided with a switching valve 35 and a vacuum pump 36.

Figure 4:
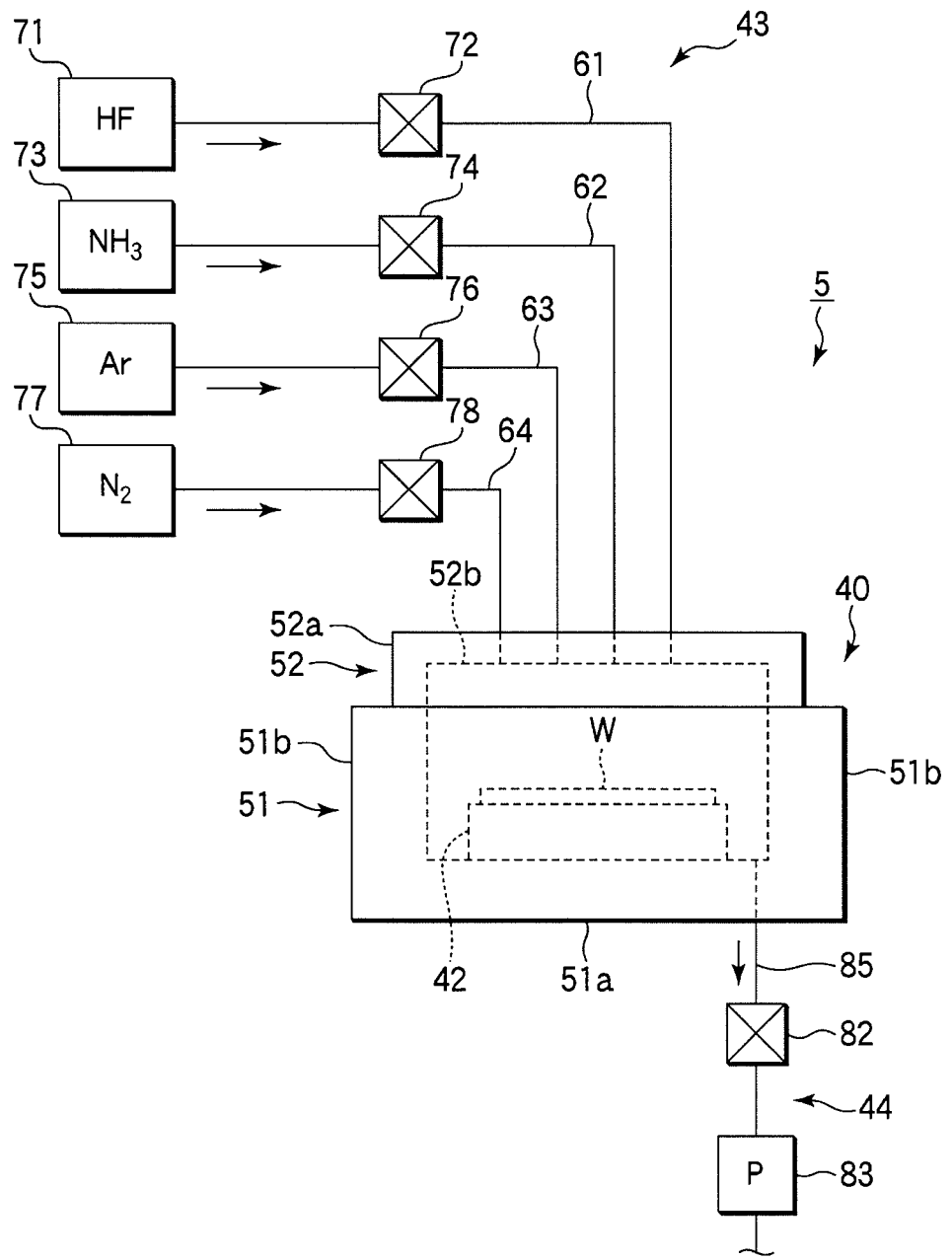
FIG. 4 is a side view schematically showing the structure of a COR processing apparatus disposed in the processing system shown in FIG. 1.
Figure 5:
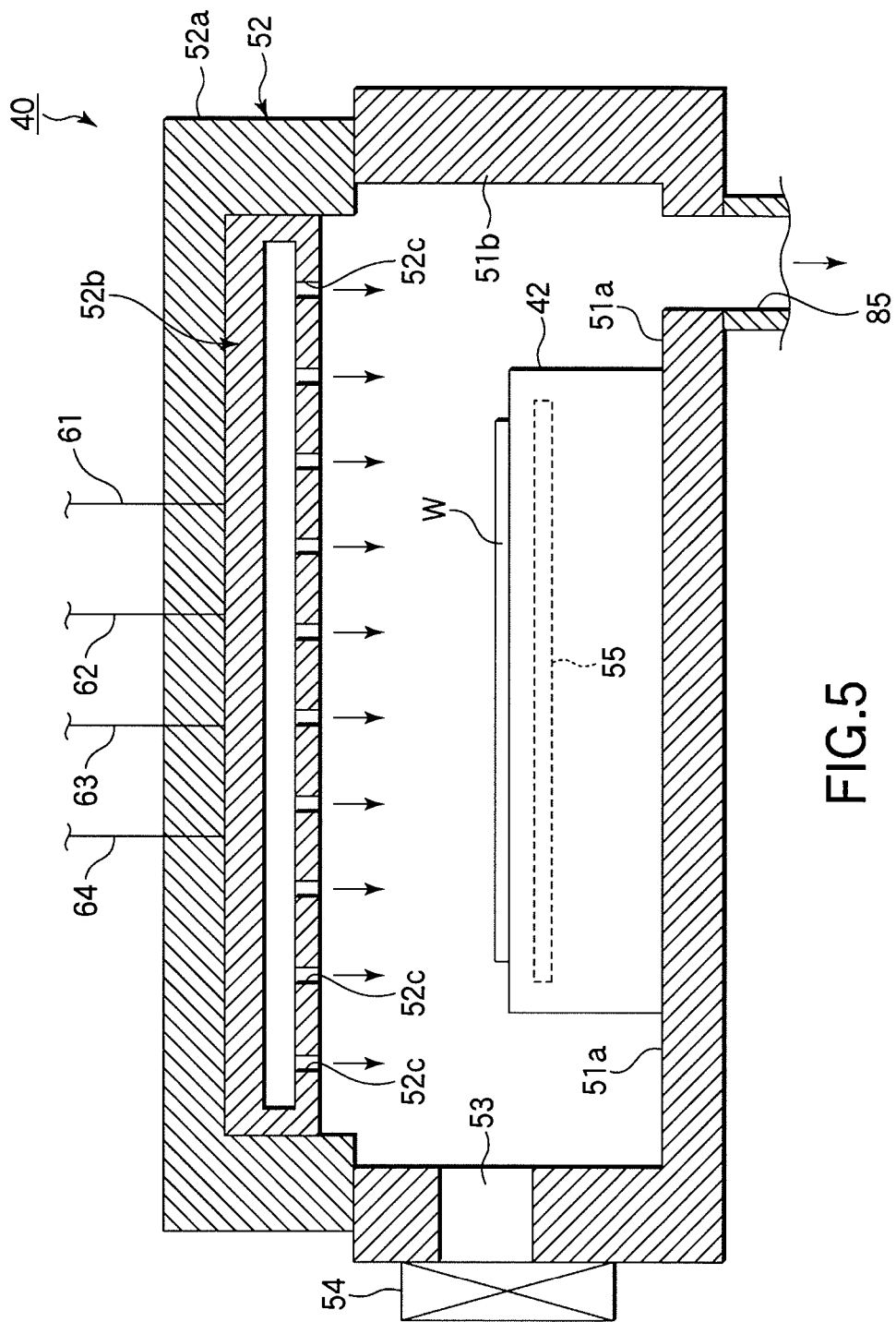
FIG. 5 is a sectional side view schematically showing the structure of the chamber of the COR processing apparatus disposed in the processing system shown in FIG. 1.

As shown in FIGS. 4 and 5, each of the COR processing apparatuses 5 includes an airtight chamber 40 provided with a table 42 disposed therein to support a wafer W essentially in a horizontal state. The COR processing apparatus 5 includes a gas supply mechanism 43 for supplying HF gas, $NH_3$ gas, and so forth into the chamber 40, and an exhaust mechanism 44 for exhausting gas from inside the chamber 40. When HF gas and $NH_3$ gas are supplied into the chamber 40 while the pressure of the chamber 40 is maintained at a predetermined value, these gases come into contact with a wafer W and act on an oxide film ($SiO_2$) formed on the wafer W, so that ammonium fluorosilicate (($NH_4)_2SiF_6$) is generated as a reaction product. The oxide film to be processed may be a natural oxide film formed on the surface of the wafer W or an oxide film used as a component of devices.

The chamber 40 is formed of a chamber main body 51 and a lid 52. The chamber main body 51 includes a bottom portion 51a and an essentially cylindrical sidewall portion 51b. The bottom of the sidewall portion 51b is closed by the bottom portion 51a and the top of the sidewall portion 51b is formed as an opening. The lid 52 is attached to close this top opening. The lid 52 is airtightly attached to the sidewall portion 51b with a seal member (not shown) interposed therebetween to ensure that the interior of the chamber 40 is kept airtight.

As shown in FIG. 5, a transfer port 53 is formed in the sidewall portion 51b to transfer a wafer therethrough to and from the chamber 20 of the PHT processing apparatus 4. The transfer port 53 is configured to be opened and closed by a gate valve 54. Accordingly, the chamber 40 is connected through the gate valve 54 to the chamber 20 of the PHT processing apparatus 4.

The lid 52 includes a lid main body 52a and a showerhead 52b for delivering a process gas. The showerhead 52b is disposed at the bottom of the lid main body 52a, so that the bottom of the showerhead 52b serves as the inner surface (the bottom) of the lid 52. The showerhead 52b forms the ceiling of the chamber 40 above the table 42 to supply various gases from above onto a wafer W placed on the table 42. The showerhead 52b has a plurality of delivery ports 52c distributed all over the bottom thereof for delivering a gas.

The table 42 is essentially circular in the plan view and is fixed on the bottom portion 51a. The table 42 is provided with a temperature adjusting member 55 disposed therein to adjust the temperature of the table 42. For example, the temperature adjusting member 55 comprises a conduit for circulating a temperature adjusting medium (such as water), so that the temperature of the table 42 can be adjusted by heat exchange with the temperature adjusting medium flowing through the conduit, and the temperature of the wafer W placed on the table 42 is thereby controlled.

The gas supply mechanism 43 includes the showerhead 52b, an HF gas supply passage 61 for supplying HF gas into the chamber 40, an $NH_3$ gas supply passage 62 for supplying $NH_3$ gas, an Ar gas supply passage 63 for supplying Ar as an inactive gas, and an $N_2$ gas supply passage 64 for supplying $N_2$ gas. The HF gas supply passage 61, $NH_3$ gas supply passage 62, Ar gas supply passage 63, and $N_2$ gas supply passage 64 are connected to the showerhead 52b, so that HF gas, $NH_3$ gas, Ar gas, and $N_2$ gas can be delivered through the showerhead 52b into the chamber 40.

The HF gas supply passage 61 is connected to an HF gas supply source 71. The HF gas supply passage 61 is provided with a flow rate regulation valve 72 configured to open and close the passage and to adjust the supply flow rate of HF gas. Similarly, the $NH_3$ gas supply passage 62 is connected to an $NH_3$ gas supply source 73. The $NH_3$ gas supply passage 62 is provided with a flow rate regulation valve 74 configured to open and close the passage and to adjust the supply flow rate of ammonia gas. The Ar gas supply passage 63 is connected to an Ar gas supply source 75. The Ar gas supply passage 63 is provided with a flow rate regulation valve 76 configured to open and close the passage and to adjust the supply flow rate of Ar gas. The $N_2$ gas supply passage 64 is connected to an $N_2$ gas supply source 77. The $N_2$ gas supply passage 64 is provided with a flow rate regulation valve 78 configured to open and close the passage and to adjust the supply flow rate of nitrogen gas.

The exhaust mechanism 44 includes an exhaust passage 85 provided with a switching valve 82 and a vacuum pump 83 for performing forcible exhaust. One end of the exhaust passage 85 is connected to a hole formed in the bottom portion 51a of the chamber 40.

Some of the components of the COR processing apparatus 5, such as the chamber 40 and table 42, are made of Al. The Al material of the chamber 40 may be bare Al or Al having an inner surface prepared by anodic oxidation (which corresponds to the inner surface of the chamber main body 51 and the bottom surface of the showerhead 52b). On the other hand, since the Al surface of the table 42 is required to have high wear resistance, the surface is preferably prepared by anodic oxidation to form an oxide coating ($Al_2O_3$), which has high wear resistance.

Figure 6:
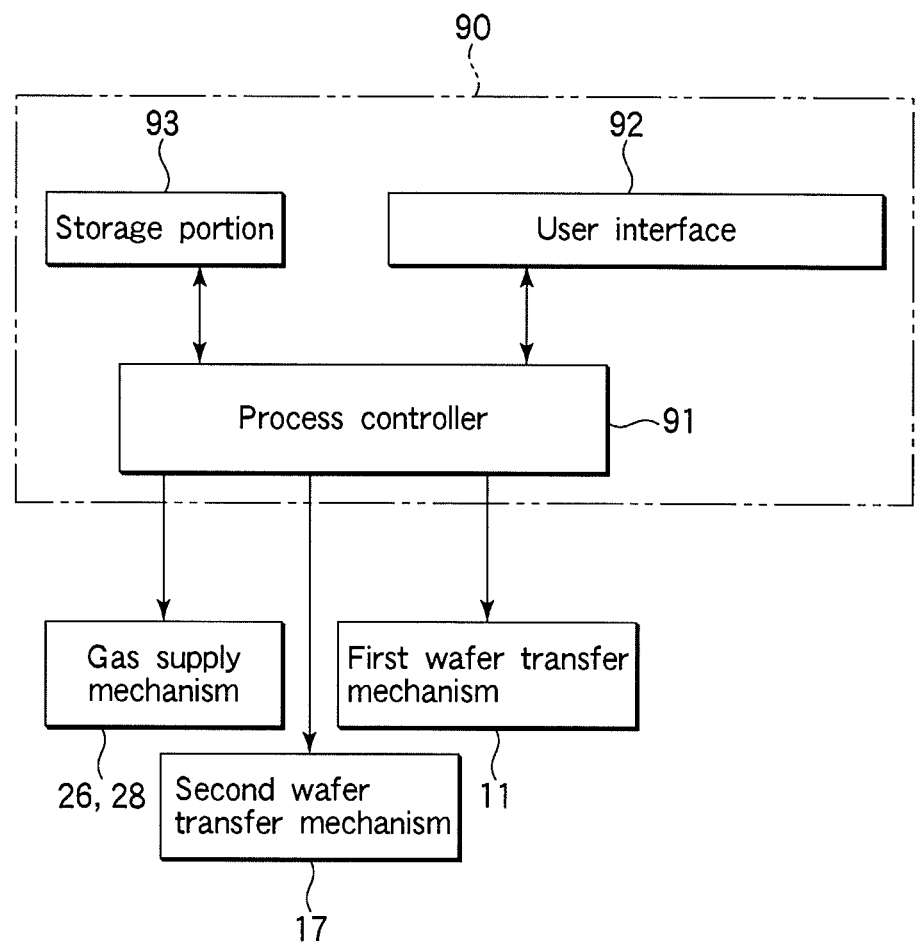
FIG. 6 is a block diagram showing the structure of a control section used in the processing system shown in FIG. 1.

As shown in FIG. 1, the processing system 1a includes a control section 90. As shown in FIG. 6, the control section 90 includes a process controller 91 comprising a microprocessor (computer) for controlling the respective components of the processing system 1a. The process controller 91 is connected to a user interface 92, which includes, e.g., a keyboard and a display, wherein the keyboard is used for an operator to input commands for operating the processing system 1a, and the display is used for showing visualized images of the operational status of the processing system 1a. The process controller 91 is further connected to a storage portion 93, which stores recipes i.e., control programs and various databases for the process controller 91 to control the processing system la so as to perform various processes including, e.g., process gas supply and gas exhaust for the chamber 40 in the COR processing apparatus 5, and for the respective components of the processing system 1a to perform predetermined processes in accordance with process conditions. The recipes are stored in the storage medium of the storage portion 93. The storage medium may be of the stationary type, such as a hard disk, or of the portable type, such as a CD-ROM, DVD, or flash memory. Alternatively, the recipes may be used online while they are transmitted from another apparatus through, e.g., a dedicated line, as needed.

A required recipe is retrieved from the storage portion 93 and executed by the process controller 91 in accordance with an instruction or the like input through the user interface 92. Consequently, the processing system 1a can perform a predetermined process under the control of the process controller 91.

Particularly, according to this embodiment, under the control of the process controller 91, a gas process is performed in the COR processing apparatus 5 and then a heating process is performed by use of an atmosphere of an inactive gas, such as $N_2$ gas, in the PHT processing apparatus 4. Further, after this heating process, a gas process is continuously performed by use of an atmosphere of a gas, such as $NH_3$ gas, which reacts with fluorine. Accordingly, the process controller 91 is preset to control the gas supply mechanisms 26 and 28 to supply the inactive gas into the chamber 20 and then supply the reactive gas into the chamber 20.

Next, an explanation will be given of such process operations of the processing system 1a.

At first, the structure of a wafer W to be processed by the processing system 1a will be explained.

Figure 7A:
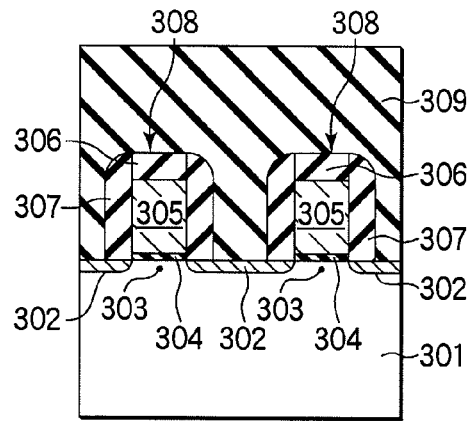
FIGS. 7A to 7F are sectional views showing a structure near the surface of a wafer being processed in the processing system shown in FIG. 1.

FIG. 7A is a sectional view showing a main portion near the surface (device formation surface) of a wafer W. The wafer W comprises a semiconductor substrate 301, such as a silicon substrate 301. The substrate 301 is provided with source/drain regions 302 formed in the surface and having a conductivity type opposite to that of the substrate 301. The source/drain regions 302 are present with a channel region 303 interposed therebetween, on which a gate insulating film 304 consisting of a thermal oxide film ($SiO_2$) is formed by thermally oxidizing the substrate 301. A gate electrode consisting of a conductive poly-silicon film 305 is formed on the gate insulating film 304. A cap layer 306 made of, e.g., silicon nitride ($Si_3N_4$) is formed on the conductive poly-silicon film 305. Sidewall insulating films 307 made of, e.g., silicon nitride ($Si_3N_4$) are formed on the sidewalls of the conductive poly-silicon film 305 and cap layer 306. The gate insulating film 304, conductive poly-silicon film 305, cap layer 306, and sidewall insulating films 307 constitute a gate electrode structure 308. The substrate 301 with the gate electrode structure 308 disposed thereon is covered with an inter-level insulating film 309 made of a low dielectric constant insulating material, such as SOD (Spin On Dielectric).

Figure 7D:
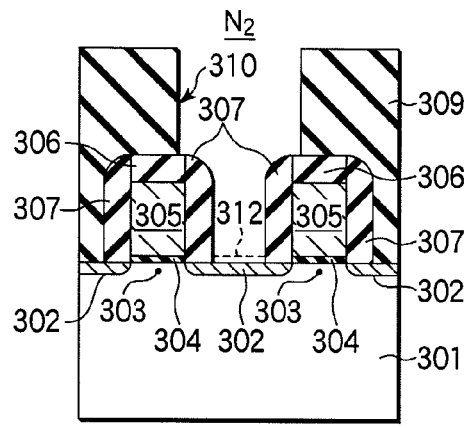
Figure 7B:
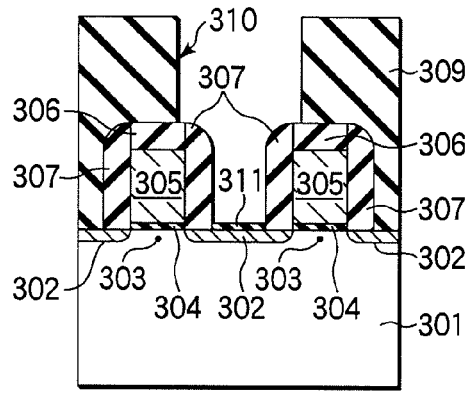

As shown in FIG. 7B, a contact hole 310 is formed in the inter-level insulating film 309 of the structure shown in FIG. 7A. The contact hole 310 formed in the inter-level insulating film 309 reaches the corresponding one of the source/drain regions 302. As shown in FIG. 7B, the contact hole 310 is formed by self alignment relative to the sidewall insulating films 307 by use of the difference between the etching rate of the inter-level insulating film 309 and the etching rate of the sidewall insulating films 307, which is made of silicon nitride different from the material of the inter-level insulating film 309. After the etching of the inter-level insulating film 309 is finished, a surface portion of the substrate 301 at the bottom of the contact hole 310, i.e., the surface of the source/drain region 302, is exposed and comes into contact with oxygen, and so a natural oxide film ($SiO_2$) 311 is formed. The processing system 1a described above can be utilized to remove this natural oxide film 311, for example.

Specifically, wafers W having the state shown in FIG. 7B are stored in a carrier C and are transferred to the processing system 1a. In the processing system 1a, the atmospheric side gate valve 16 of one of the load lock chambers 3 is opened, and a wafer W is transferred by one of the transfer arms 11a and 11b of the first wafer transfer mechanism 11 from the carrier C placed on the load/unload section 2 into this load lock chamber 3. In the load lock chamber 3, the wafer W is transferred from the transfer arm 11a or 11b onto the wafer transfer arm 17a of the second wafer transfer mechanism 17 of the load lock chamber 3.

Then, the atmospheric side gate valve 16 is closed, and the interior of the load lock chambers 3 is vacuum-exhausted. Then, the gate valves 22 and 54 are opened, and the wafer transfer arm 17a is extended into the COR processing apparatus 5 and places the wafer W onto the table 42.

Then, the transfer arm 17a is returned back into the load lock chambers 3, and the gate valve 54 is closed to make the interior of the chamber 40 airtight. Then, $NH_3$ gas, Ar gas, and $N_2$ gas are supplied from the gas supply mechanism 43 into the chamber 40. Further, the temperature of the wafer W is adjusted by the temperature adjusting member 55 to a predetermined target value (for example, about 25° C.)

Then, HF gas is supplied from the gas supply mechanism 43 into the chamber 40. When HF gas is supplied into the chamber 40 with $NH_3$ gas supplied in advance, an atmosphere containing HF gas and $NH_3$ gas is formed inside the chamber 40, and starts a COR process on the wafer W. Consequently, the natural oxide film 311 present on the surface of the wafer W inside the contact hole 310 chemically reacts with molecules of the hydrogen fluoride gas and molecules of the ammonia gas, and so it is transformed into a reaction product 312, as shown in FIG. 7C. During the COR process, the interior of the chamber 40 is maintained at a predetermined pressure, such as about 13.3 Pa (0.1 Torr).

As the reaction product 312, ammonium fluorosilicate (($NH_4)_2SiF_6$), water, and so forth are generated.

After this process is finished, the gate valves 22 and 54 are opened, and the processed wafer W is transferred by the transfer arm 17a of the second wafer transfer mechanism 17 from the table 42 onto the table 23 inside the chamber 20 of the PHT processing apparatus 4. Then, the transfer arm 17a is returned back into the load lock chambers 3, and the gate valves 22 and 54 are closed. Then, while $N_2$ gas is supplied into the chamber 20, the wafer W on table 23 is heated by the heater 24. The reaction product 312 generated by the COR process is evaporated by this heating and removed from the bottom of the contact hole 310. Consequently, this portion of the substrate 301, i.e., the surface of the source/drain region 302 in this embodiment, is exposed, as shown in FIG. 7D.

As described above, where the PHT process is performed after the COR process, the natural oxide film 311 is removed within a dry atmosphere, so that no water marks or the like are generated. Further, the natural oxide film 311 is removed by a plasma-less process, the wafer W is prevented from being damaged. Since the COR process stops making progress of etching when a predetermined time has elapsed, end point control thereof is unnecessary because no reaction is developed even if over-etching is preset.

Figure 7E:
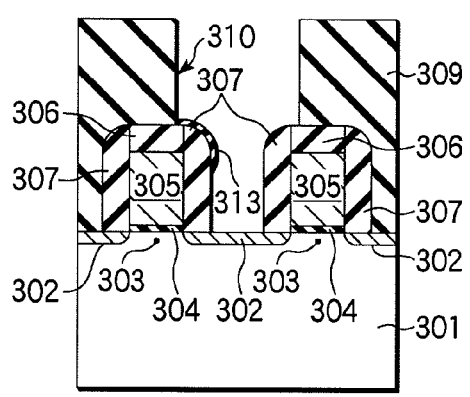
Figure 7C:
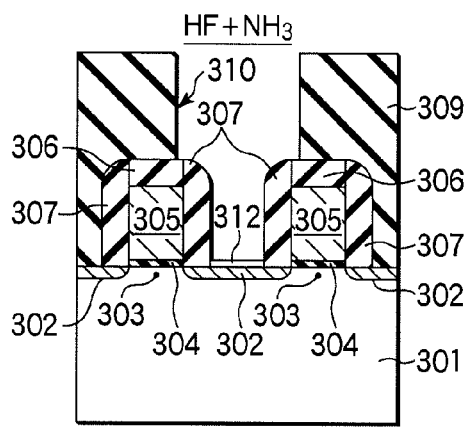
Figure 9A:
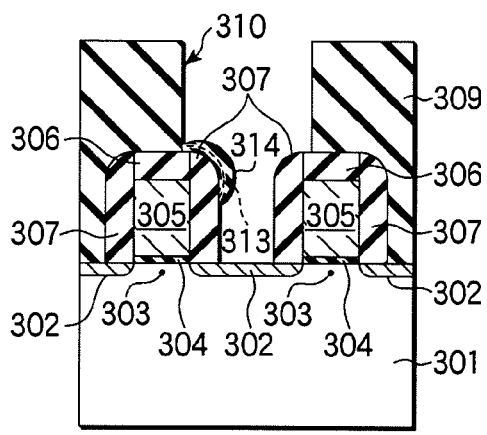
FIGS. 9A and 9B are sectional views showing a structure near the surface of a wafer according to comparative examples.
Figure 9B:
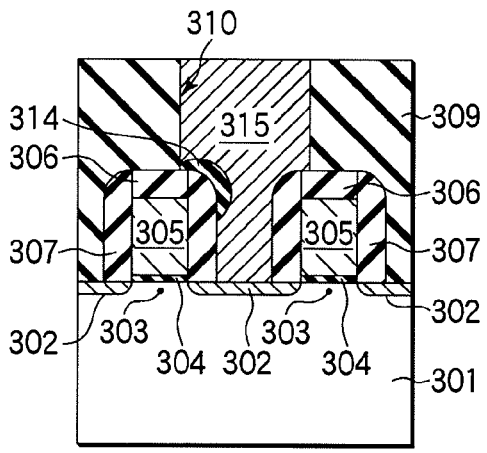

However, as shown in FIG. 7E, after the PHT process is finished, fluorine and/or fluorine compound (such as CF), which are decomposition products of ammonium fluorosilicate ($(NH_4)_2SiF_6$), may be left as residues 313 inside the contact hole 310. The residues 313 contain a halogen, such as fluorine in this example. If the wafer W with such residues 313 left thereon is exposed to the atmospheric air, the residues 313 may involve components, such as moisture ($H_2O$), contained in the atmospheric air, and cause abnormal reactions with some components of the integrated circuit, such as the substrate 301, gate electrode (poly-silicon film 305), sidewall insulating films 307, inter-level insulating film 309, and interconnection layers formed later. FIGS. 9A and 9B show comparative examples where abnormal reactions are caused.

As shown in FIG. 9A, if the wafer W with the residues 313 left thereon is exposed to the atmospheric air, components (such as $H_2O$) contained in the atmospheric air, a halogen contained in the residues 313, and structural components (such as Si, $SiO_2$, and $Si_3N_4$), on which the residues 313 are deposited, react with each other and bring about a reaction product 314 grown larger. Further, if the reaction product 314 is kept exposed to the atmospheric air, the product 314 may be transformed into a different foreign substance. When an interconnection layer 315 is formed in the contact hole 310 with the reaction product 314 and/or foreign substance left therein, the semiconductor integrated circuit device is adversely affected such that the interconnection layer 315 is thinner, as shown in FIG. 9B, for example. Even if the interconnection layer 315 is thinner, the electric connection between the interconnection layer 315 and source/drain region 302 is not completely cut off, but allows the semiconductor integrated circuit device to operate. However, semiconductor integrated circuit devices formed on the same wafer may largely differ from each other in characteristic, and/or this semiconductor integrated circuit device may suffer a difficulty in operating at a high speed. Further, the reaction product 314 and/or foreign substance may be grown to a size that clogs the entrance of the contact hole 310. Alternatively, with an increase in the miniaturization level in the future, the contact hole 310 may become smaller so that it can be easily clogged with the reaction product 314 and/or foreign substance even if they are small. Such clogging may deteriorate the yield of semiconductor integrated circuit devices.

In light of residues 313 that can be generated after the PHT process, this embodiment is arranged to remove such residues 313, even if the residues 313 are generated by any chance.

Specifically, after the wafer W is subjected to the gas process, i.e., the COR process in this embodiment, the wafer W is subjected to a heating process, i.e., the PHT process in this embodiment, while the wafer W is subjected to a gas process within an atmosphere containing a reactive gas that reacts with fluorine. Alternatively, after the wafer W is subjected to the PHT process, the wafer W is subjected to a gas process within an atmosphere containing a reactive gas that reacts with fluorine. In this way, the wafer W is subjected to a gas process to prevent residues 313 from being generated or to remove residues 313 even if they are generated.

For example, in order to remove residues 313 possibly generated, this embodiment is arranged to supply $N_2$ gas into the chamber 20 while heating the wafer W on the table 23 by the heater 24, and then, as it is, to supply a gas that reacts with fluorine into the chamber 20 without opening the gate valves 22 and 54.

Figure 7F:
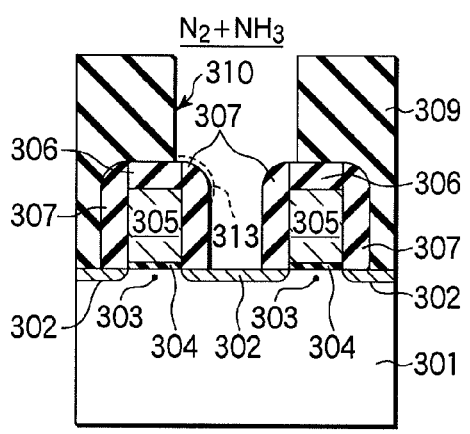

In this embodiment, as shown FIG. 7D, the wafer W is heated within an $N_2$ gas atmosphere, so that the reaction product 312 and moisture, which has been generated in the process of transformation of the natural oxide film 311 into the reaction product 312, are sufficiently evaporated from the wafer W. After these substances are sufficiently removed, as shown in FIG. 7F, a gas, such as $NH_3$ gas in this embodiment, which reacts with fluorine is supplied into the chamber 20 in addition to $N_2$ gas, so that residues 313 containing fluorine and/or fluorine compound are removed. Particularly, where $NH_3$ gas is used as a gas that reacts with fluorine, the wafer W is preferably treated by the PHT process to sufficiently evaporate moisture ($H_2O$) during the PHT process, before the residues 313 are removed, i.e., before the wafer W is subjected to a gas process within an atmosphere containing $NH_3$ gas. This is so, because $NH_3$ gas can easily react with $H_2O$ and produce ammonia water, although by a slight amount, that dissolves structural components on the wafer W. Where $NH_3$ gas is used to remove the residues 313, moisture should be sufficiently evaporated to suppress undesirable etching of structural components on the wafer W. In order to sufficiently evaporate moisture, as shown in FIG. 7D, a heating process is preferably performed within an atmosphere of an inactive gas, such as $N_2$ gas, before a gas that reacts with fluorine is supplied into the chamber 20.

Further, the step shown in FIG. 7F should be performed under conditions that allow the residues 313 to be sufficiently removed, even if the residues 313, which contain fluorine and/or fluorine compound, are present by any chance. In light of this, this step is preferably performed while the wafer W is being heated to promote a reaction for removing the residues 313. For example, the wafer W is set at a temperature of 100 to 200° C. The process pressure is preferably set at a low pressure to promote evaporation of the residues 313. For example, the process pressure is set to be 500 to 1,000 mTorr.

A series of processes shown in FIGS. 7C to 7F performed in the processing system 1a may be stored as a recipe in the storage medium of the storage portion 93 of the control section 90. Where such a recipe is stored in the storage medium, it can be executed under the control of the process controller 91. As shown in FIG. 7F, where the residue removal process is performed continuously to the PHT process, the residues 313 can be removed even if the residues 313 are present by any chance. Consequently, it is possible to decrease the probability of abnormal reactions being caused in semiconductor integrated circuit devices and thereby maintain and improve the characteristic and yield of the semiconductor integrated circuit devices.

After the residue removal process is finished, the wafer W is transferred by the transfer arm 17a of the second wafer transfer mechanism 17 into the load lock chamber 3. Then, the gate valve 22 is closed, the interior of the load lock chambers 3 is returned to atmospheric pressure, and the wafer W is inserted by the first wafer transfer mechanism 11 into a carrier C placed in the load/unload section 2.

Figure 8:
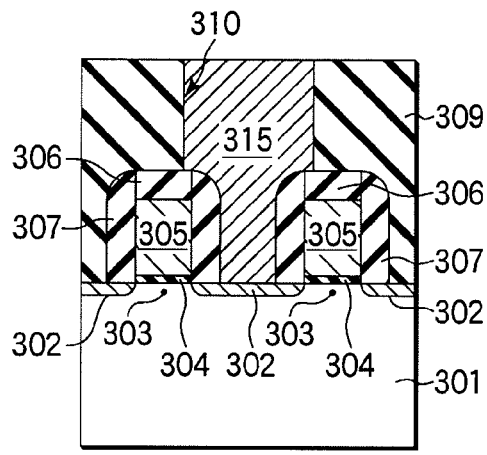
FIG. 8 is a sectional view showing a structure near the surface of the wafer processed in the processing system shown in FIG. 1.

The operations described above are repeated the necessary times corresponding to the number of wafers W stored in a carrier C, so that the processes on the wafers W are finished. Thereafter, as shown in FIG. 8, other processes for manufacturing semiconductor integrated circuit devices are continuously performed, such that, e.g., an interconnection layer 315 is formed in the contact hole 310.

As described above, according to the first embodiment, residues containing fluorine and/or fluorine compound are removed, so that the probability of abnormal reactions being caused is lowered. Consequently, there is provided a processing system (substrate processing system) and substrate processing method that can maintain and improve the characteristic and yield of semiconductor integrated circuit devices. Further, there is provided a computer readable storage medium that stores a recipe (program) for controlling the processing system (substrate processing system) in accordance with the substrate processing method.

Figure 10:
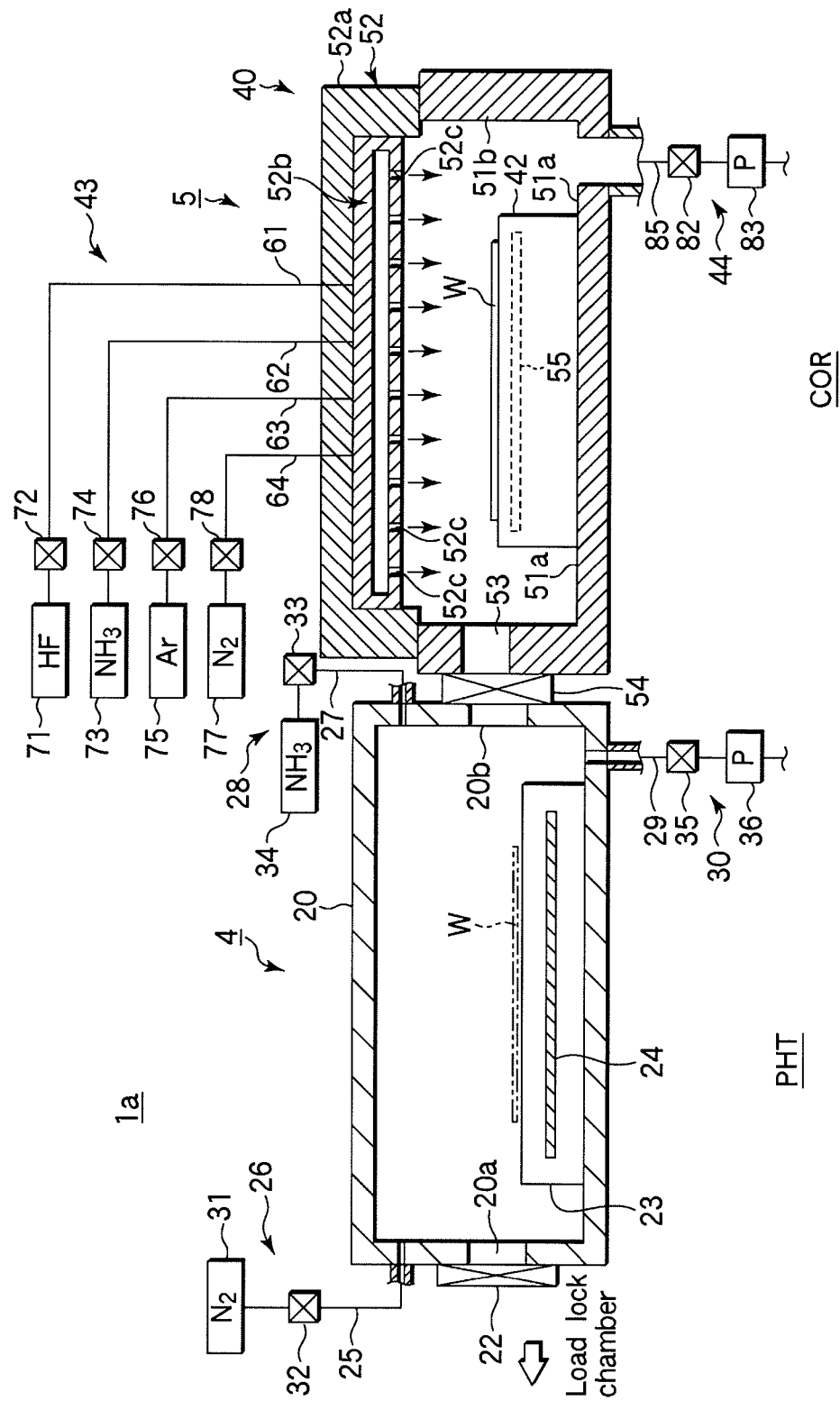
FIG. 10 is a sectional view showing part of the processing system according to the first embodiment of the present invention, which corresponds to the PHT processing apparatus and COR processing apparatus.

Further, according to the first embodiment, as shown in FIG. 10, the processing system 1a is arranged such that a natural oxide film formed on the surface of a target substrate, such as a wafer W, is transformed into a reaction product inside the vacuum chamber 40 of the COR processing apparatus 5. Thereafter, without being exposed to the atmospheric air, the wafer W with the reaction product thus formed is transferred through the gate valve 54 into the vacuum chamber 20 of the PHT processing apparatus 4. Then, inside the chamber 20, the reaction product is evaporated, and the residues 313 containing fluorine and/or fluorine compound are removed from the wafer W. In other words, the first embodiment is arranged to remove the residues 313 without exposing the target substrate to the atmospheric air. Consequently, as compared to a case where a target substrate is exposed to the atmospheric air and transferred to another processing system to remove the residues 313, this embodiment make it possible to remove the residues 313 while decreasing the probability of abnormal growth of the residues 313 or the probability of re-contamination inside the load/unload section 2 or a carrier C due to the wafer W transferred therein along with the residues 313 deposited thereon. Consequently, the residues 313 can be reliably removed while the target substrate is maintained in a clean state. Such removal of the residues 313 is effectively applied to semiconductor integrated circuit devices manufactured in accordance with higher levels of miniaturization and integration.

In addition, according to the first embodiment, evaporation of the reaction product 312 and removal of the residues 313 are continuously performed in this order inside the vacuum chamber 20 of the PHT processing apparatus 4. Consequently, it is possible to enhance the effect described above in that the residues 313 are reliably removed while the target substrate is maintained in a clean state.

(Second Embodiment)

Figure 11:
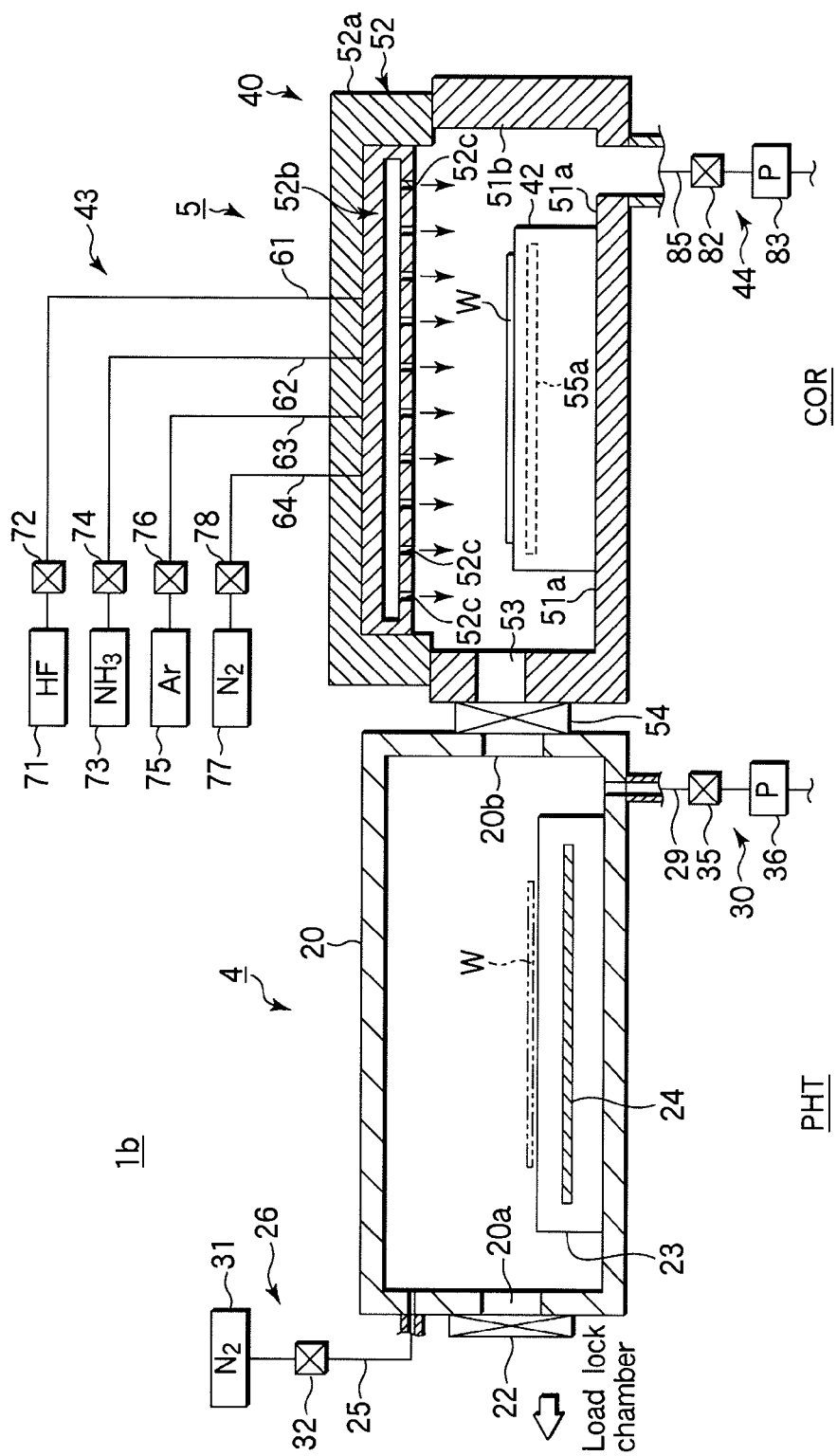
FIG. 11 is a sectional view showing part of a processing system according to a second embodiment of the present invention, which corresponds to a PHT processing apparatus and a COR processing apparatus.

FIG. 11 is a sectional view showing part of a processing system 1b according to a second embodiment of the present invention, which corresponds to a PHT processing apparatus 4 and a COR processing apparatus 5.

As shown in FIG. 10, the first embodiment is arranged to supply a gas, such as $NH_3$ gas, which reacts with fluorine into the chamber 20 of the PHT processing apparatus 4.

However, the chamber 40 of the COR processing apparatus 5 is originally provided with a supply passage for supplying $NH_3$ gas. This facility can be used to perform a process for removing the residues 313.

As shown in FIG. 11, the processing system 1b according to the second embodiment differs from the processing system 1a according to the first embodiment, such that the chamber 20 of the PHT processing apparatus 4 is not provided with a supply passage for supplying a gas, such as $NH_3$ gas, which reacts with fluorine.

The processing system 1b according to the second embodiment is arranged to perform a process for removing the residues 313, as follows.

At first, a wafer W is transferred into the chamber 40 through the gate valves 22 and 54 and chamber 20. Then, the gate valve 54 is closed, and the COR process (a process for transforming a natural oxide film into a reaction product) is performed inside the chamber 40.

Then, the wafer W is transferred through the gate valve 54 from the chamber 40 into the chamber 20. Then, the gate valves 22 and 54 are closed, and the PHT process (a process for evaporating the reaction product) is performed inside the chamber 20.

Then, the wafer W is transferred through the gate valve 54 from the chamber 20 into the chamber 40. Then, the gate valve 54 is closed, and a process for removing the residues 313 is performed inside the chamber 40.

For example, these COR process, PHT process, and process for removing the residues 313 are performed under the same conditions as those of the first embodiment.

In the processing system 1b according to the second embodiment, the COR process and process for removing the residues 313 are performed inside the chamber 40. The process for removing the residues 313 is a heating process. Accordingly, the table 42 may be preferably provided with a heater disposed therein for heating the wafer W in addition to the temperature adjusting member 55 for adjusting the temperature of the wafer W. Alternatively, the temperature adjusting member 55 may be preferably arranged to have a heating function in addition to the temperature adjust function.

The processing system 1b according to the second embodiment can also have the effect of removing the residues 313, as in the first embodiment. Further, the chamber 20 of the PHT processing apparatus 4 does not have to be provided with a supply passage for supplying a gas, such as $NH_3$ gas, which reacts with fluorine, and so the structure of the processing system 1b can be preferably simplified.

(Third Embodiment)

After the residues 313 are removed, a gas process may be performed on the surface of a target substrate, such as a wafer W, by supplying a reducing gas (such as, $H_2$, $CH_2$, or $NH_3$), so as to apply hydrogen termination to the surface of the wafer W treated by the residue removal.

Particularly, where a natural oxide film is removed from the surface of the silicon substrate 301 of a wafer W, hydrogen can be easily attached to silicon dangling bonds (disconnected bonds) exposed on the substrate surface. Consequently, the surface of the substrate 301 becomes inactive and easily generates traps, which make it difficult to manufacture semiconductor integrated circuit devices of high quality.

Figure 12:
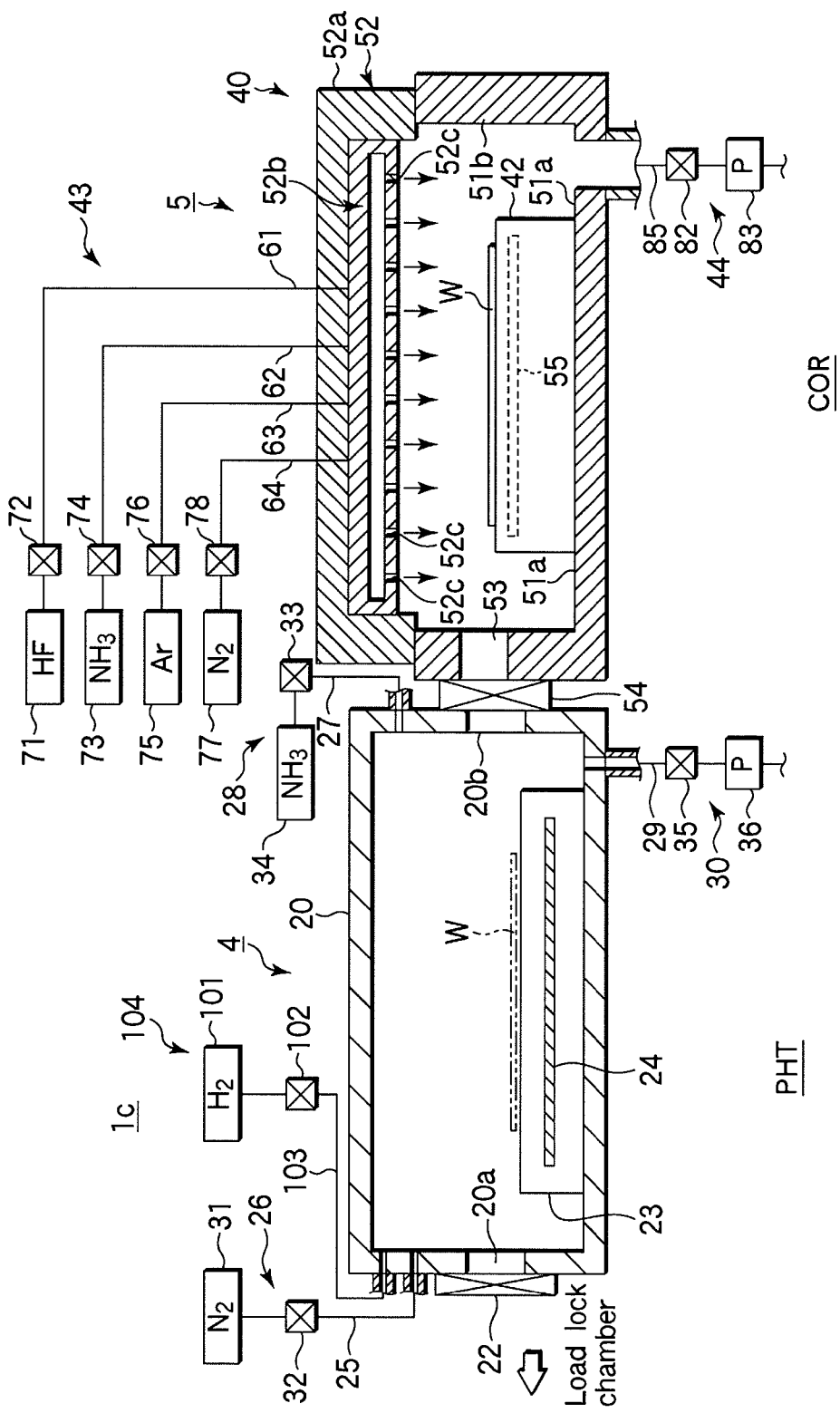
FIG. 12 is a sectional view showing part of a processing system according to one example of a third embodiment of the present invention, which corresponds to a PHT processing apparatus and a COR processing apparatus.

For example, a processing system for this purpose is arranged as shown in FIG. 12. Specifically, the chamber 20 is provided with a hydrogen ($H_2$) gas supply mechanism 104 including a gas supply passage 103 for supplying hydrogen gas into the chamber 20 from a hydrogen gas supply source 101 through a flow rate regulation valve 102.

The processing system 1c according to this example can supply $H_2$ gas into the chamber 20 of the PHT processing apparatus 4, and so this system is suitably applied to a case where a process for removing the residues 313 is performed inside the chamber 20. After the process for removing the residues 313 is performed, the hydrogen termination process is performed inside the same chamber 20, so that hydrogen termination is applied to the surface of the wafer W, particularly, the surface of the silicon substrate 301, before other substances are attached to dangling bonds on the surface. Consequently, the hydrogen termination can be efficiently performed on the surface of the silicon substrate 301.

Figure 13:
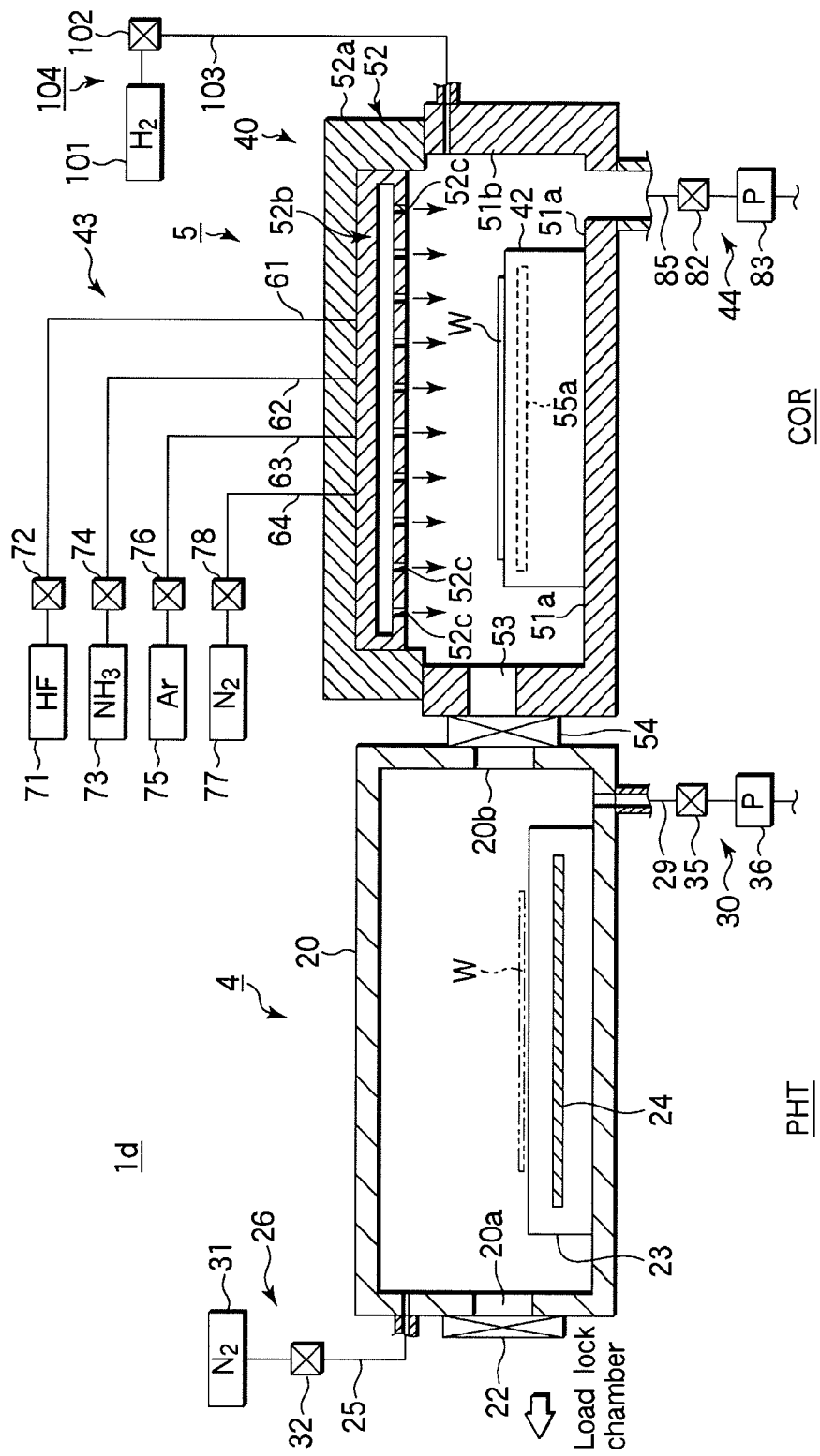
FIG. 13 is a sectional view showing part of a processing system according to an alternative example of the third embodiment of the present invention, which corresponds to a PHT processing apparatus and a COR processing apparatus.

As an alternative example, as shown in FIG. 13, the hydrogen gas supply mechanism 104 shown in FIG. 12 may be connected to the chamber 40 of the COR processing apparatus 5.

The processing system 1d according to this alternative example can supply $H_2$ gas into the chamber 40 of the COR processing apparatus 5, and so this system is suitably applied to a case where a process for removing the residues 313 is performed inside the chamber 40.

As described above, according to the third embodiment, after the process for removing the residues 313 is performed, the hydrogen termination process is further performed on the wafer W in the same chamber, for example. Where the cleaned surface of the wafer W, from which the residues 313 have been removed, is further subjected to the hydrogen termination in the same chamber, semiconductor integrated circuit devices of high quality can be more reliably manufactured.

(Fourth Embodiment)

In the first to third embodiments, a gas process is performed on a wafer W within an atmosphere of a mixture of HF gas and $NH_3$ gas, so that a natural oxide film is transformed into a reaction product. However, a method for transforming a natural oxide film into a reaction product is not limited to this method. For example, as a gas containing fluorine, $NF_3$ gas may be used in place of HF gas.

Where $NF_3$ gas is used, a chamber including a plasma generating section is used, for example, and $N_2$ gas and $H_2$ gas are supplied into the plasma generating section to generate plasma of $N_2$ gas and $H_2$ gas. Then, while the plasma of $N_2$ gas and $H_2$ gas (i.e., radicals) is supplied onto a wafer W, $NF_3$ gas is added into the flow of the plasma.

According to these embodiments of the present invention, there is provided a substrate processing method and substrate processing system that can decrease the probability of abnormal reactions being caused and thereby maintain and improve the characteristic and yield of semiconductor integrated circuit devices. Further, there is provided a computer readable storage medium that stores a program for controlling the substrate processing system.

The present invention has been described with reference to first to fourth embodiments, but the present invention is not limited to the embodiments described above, and it may be modified in various manners.

For example, the embodiments described above are explained in a case where a natural oxide film is removed from the bottom of a contact hole formed on a wafer W. However, the preset invention is applicable to any process for removing a natural oxide film other than a process for removing a natural oxide film from the bottom of a contact hole.

In place of removal of a natural oxide film, the preset invention may be applied to another process used for manufacturing semiconductor integrated circuit devices, where a gas process is performed by use of a fluorine-containing process gas to form a fluorine-containing reaction product, and then a process is preformed to decompose the reaction product. Also in this case, it is possible to provide the effect of removing residues containing fluorine and/or fluorine compound.

In the embodiments described above, the PHT processing apparatus 4 and COR processing apparatus 5 include their own $N_2$ gas supply source and $NH_3$ gas supply source. However, the PHT processing apparatus 4 and COR processing apparatus 5 may include their own gas supply sources or share common gas supply sources.

In the embodiments described above, $NH_3$ is used as a gas that can easily react with fluorine, but another gas, such as CO or NO, may be alternatively used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing system comprising:
a first gas supply section configured to supply a fluorine-containing gas to a process object;
a second gas supply section configured to supply a reactive gas that reacts with fluorine to the process object; and
a control section configured to control operation of the system,
wherein the control section includes a computer readable non-transitory storage medium that stores a control program for execution on a computer, the control program, when executed, causing the control section to control the system to conduct a process sequence for processing a target substrate as the process object, the process sequence including:
performing a first gas process of processing the target substrate within an atmosphere containing the fluorine-containing gas supplied from the first gas supply section to form a reaction product containing fluorine on a surface of the target substrate;
performing a heating process to evaporate the reaction product containing fluorine from the surface of the target substrate; and
performing a second gas process of processing the target substrate within an atmosphere containing the reactive gas supplied from the second gas supply section to prevent residues of the reaction product containing fluorine from being generated or to remove the residues if they are generated.

2. The system according to claim 1, wherein the system further comprises a heating mechanism configured to heat the process object.

3. The system according to claim 2, wherein the second gas process is performed while heating the target substrate by the heating mechanism.

4. The system according to claim 2, wherein the heating process to evaporate the reaction product containing fluorine from the surface of the target substrate is performed without supplying either of the fluorine-containing gas and the reactive gas to the target substrate.

5. The system according to claim 1, wherein the residues contain at least one of fluorine and a fluorine compound, the residues being on the surface of the target substrate.

6. The system according to claim 5, wherein the target substrate includes a contact hole formed therein for forming an interconnection, the first gas process includes forming the reaction product inside the contact hole, and the second gas process includes removing the residues remaining inside the contact hole.

7. The system according to claim 6, wherein the first gas supply section is configured further to supply $NH_3$ gas to the process object, and the first gas process includes transforming a natural oxide film present inside the contact hole into the reaction product by causing the fluorine-containing gas and the $NH_3$ gas supplied from the first gas supply section to chemically react with the natural oxide film.

8. The system according to claim 7, wherein the reactive gas is $NH_3$ gas, and the performing the heating process further includes evaporating moisture generated on the target substrate in transformation of the natural oxide film into the reaction product.

9. The system according to claim 8, wherein the heating process includes heating the target substrate within an inactive gas atmosphere without supplying either of the fluorine-containing gas and the reactive gas to the target substrate.

10. The system according to claim 1, wherein the reactive gas is selected from the group consisting of $NH_3$, CO, and NO.

11. The system according to claim 1, wherein the fluorine-containing gas is selected from the group consisting of HF and $NF_3$.

12. The system according to claim 11, wherein the first gas process includes transforming a natural oxide film into the reaction product.

13. The system according to claim 1, wherein, after the second gas process, the process sequence further includes performing a third gas process of processing the target substrate within an atmosphere containing a reducing gas to apply hydrogen termination to the surface of the target substrate.

14. The system according to claim 1, wherein the reactive gas is $NH_3$ gas, and the performing the heating process further includes, evaporating moisture on the target substrate.

15. The system according to claim 14, wherein the heating process includes heating the target substrate within an inactive gas atmosphere without supplying either of the fluorine-containing gas and the reactive gas to the target substrate.

16. The system according to claim 1, wherein the first gas supply section is provided to a first process chamber equipped with an inactive gas supply section and an exhaust mechanism, the second gas supply section is provided to a second process chamber equipped with an inactive gas supply section and an exhaust mechanism, and the first and second process chambers are connected to each other by a gate valve.

17. The system according to claim 16, wherein a load lock chamber is connected to the second process chamber through a gate valve on a side opposite to the first process chamber, and a transfer arm is disposed inside the load lock chamber and configured to transfer the process object to and from the first and second process chambers.

18. The system according to claim 16, wherein the second process chamber further includes a gas supply section configured to supply H2 gas to apply hydrogen termination to a surface of the process object.

19. The system according to claim 1, wherein the first and second gas supply sections are provided to a process chamber equipped with an inactive gas supply section and an exhaust mechanism.

* * * * *